(12) United States Patent
Rana

(10) Patent No.: US 11,183,924 B2
(45) Date of Patent: *Nov. 23, 2021

(54) VOLTAGE MULTIPLIER CIRCUIT WITH A COMMON BULK AND CONFIGURED FOR POSITIVE AND NEGATIVE VOLTAGE GENERATION

(71) Applicant: STMicroelectronics International N.V., Schiphol (NL)

(72) Inventor: Vikas Rana, Noida (IN)

(73) Assignee: STMicroelectronics International N.V., Schiphol (NL)

(*) Notice: Subject to any disclaimer, the term of this patent is extended or adjusted under 35 U.S.C. 154(b) by 0 days.

This patent is subject to a terminal disclaimer.

(21) Appl. No.: 17/021,013

(22) Filed: Sep. 15, 2020

(65) Prior Publication Data

US 2020/0412241 A1  Dec. 31, 2020

Related U.S. Application Data

(63) Continuation of application No. 16/563,069, filed on Sep. 6, 2019, now Pat. No. 10,811,960, which is a (Continued)

(51) Int. Cl.
*H02M 3/07* (2006.01)
*H03K 19/096* (2006.01)
*G05F 1/10* (2006.01)

(52) U.S. Cl.
CPC ............... *H02M 3/07* (2013.01); *G05F 1/10* (2013.01); *H03K 19/096* (2013.01); *H02M 3/078* (2021.05)

(58) Field of Classification Search
None
See application file for complete search history.

(56) References Cited

U.S. PATENT DOCUMENTS 6,366,482 B1 * 4/2002 Jeong .................... H02M 3/073
327/535
6,404,270 B1 * 6/2002 Meng .................... H02M 3/073
327/534
(Continued)

FOREIGN PATENT DOCUMENTS

| CN | 1477773 A | 2/2004 |
|---|---|---|
| CN | 1542847 A | 11/2004 |

(Continued)

OTHER PUBLICATIONS

Second Office Action and Search Report for co-pending CN Appl. No. 201811231003.0 dated Nov. 11, 2020 (9 pages).

(Continued)

*Primary Examiner* — Thomas J. Hiltunen
(74) *Attorney, Agent, or Firm* — Crowe & Dunlevy

(57) ABSTRACT

A voltage doubler circuit supports operation in both a positive voltage boosting mode to positively boost voltage from a first node to a second node and a negative voltage boosting mode to negatively boost voltage from the second node to the first node. The voltage doubler circuit is formed by transistors of a same conductivity type that share a common bulk that is not tied to a source of any of the voltage doubler circuit transistors. A bias generator circuit is coupled to receive a first voltage from the first node and second voltage from the second node. The bias generator circuit operates to apply a lower one of the first and second voltages to the common bulk.

33 Claims, 4 Drawing Sheets

Related U.S. Application Data continuation of application No. 16/162,668, filed on Oct. 17, 2018, now Pat. No. 10,461,636.

(60) Provisional application No. 62/575,692, filed on Oct. 23, 2017.

(56) References Cited

U.S. PATENT DOCUMENTS

| | | | |
|---|---|---|---|
| 6,418,040 B1* | 7/2002 | Meng | F28D 5/00 |
| | | | 307/109 |
| 6,768,368 B2 | 7/2004 | Kaneko et al. | |
| 7,002,399 B2* | 2/2006 | Nuzzarello | G11C 5/145 |
| | | | 327/536 |
| 7,151,391 B2 | 12/2006 | Chen et al. | |
| 7,564,289 B2 | 7/2009 | Imura | |
| 7,777,557 B2* | 8/2010 | Yamahira | G11C 5/145 |
| | | | 327/536 |
| 9,225,237 B2* | 12/2015 | Ferrant | H02M 3/07 |
| 9,391,600 B2 | 7/2016 | Lau | |
| 9,634,559 B2* | 4/2017 | Kim | H02M 3/07 |
| 9,634,562 B1 | 4/2017 | Rana et al. | |
| 10,020,029 B1* | 7/2018 | Tan | H02M 3/073 |
| 10,044,260 B2* | 8/2018 | Jeon | H02M 3/073 |
| 10,461,636 B2* | 10/2019 | Rana | H02M 3/07 |
| 10,811,960 B2* | 10/2020 | Rana | H03K 19/096 |
| 10,902,926 B2* | 1/2021 | Min | H02M 1/08 |
| 2011/0050327 A1 | 3/2011 | Fujitani | |
| 2013/0207716 A1* | 8/2013 | Lee | H03K 3/012 |
| | | | 327/536 |

FOREIGN PATENT DOCUMENTS

| | | |
|---|---|---|
| CN | 104714589 A | 6/2015 |
| CN | 105703747 A | 6/2016 |
| CN | 209120057 U | 7/2019 |

OTHER PUBLICATIONS

First Office Action and Search Report for co-pending CN Appl. No. 201811231003.0 dated May 8, 2020 (8 pages).

* cited by examiner

VOLTAGE MULTIPLIER CIRCUIT WITH A COMMON BULK AND CONFIGURED FOR POSITIVE AND NEGATIVE VOLTAGE GENERATION

CROSS REFERENCE TO RELATED APPLICATIONS

This application a continuation of U.S. patent application Ser. No. 16/563,069 filed Sep. 6, 2019, which is a continuation of U.S. patent application Ser. No. 16/162,668 filed Oct. 17, 2018, now U.S. Pat. No. 10,461,636, which claims priority to U.S. Provisional Application for Patent No. 62/575,692 filed Oct. 23, 2017, the disclosures of which are incorporated by reference.

TECHNICAL FIELD

The present invention relates to voltage multiplying (for example, doubling) circuits configured to generate positive and negative voltages.

BACKGROUND

Reference is made to FIG. 1 showing a circuit diagram for a voltage doubler circuit 100. The circuit 100 includes an n-channel MOS transistor MN1 having a source (conduction) terminal coupled to node A and a drain (conduction) terminal coupled to node NA1 and an n-channel MOS transistor MN2 having a source terminal coupled to node A and a drain terminal coupled to node NA2. The transistors MN1 and MN2 are cross-coupled with the gate terminal of transistor MN1 coupled to the drain terminal of transistor MN2 at node NA2 and the gate terminal of transistor MN2 coupled to the drain terminal of transistor MN1 at node NA1.

The circuit 100 further includes an n-channel MOS transistor MN3 having a source terminal coupled to node NA1 and a drain terminal coupled to node NB1 and an n-channel MOS transistor MN4 having a source terminal coupled to node NA2 and a drain terminal coupled to node NB2. The transistors MN3 and MN4 are cross-coupled with the gate terminal of transistor MN3 coupled to the source terminal of transistor MN4 at node NA2 and the gate terminal of transistor MN4 coupled to the source terminal of transistor MN3 at node NA1.

The circuit 100 still further includes an n-channel MOS transistor MN5 having a drain terminal coupled to node B and a source terminal coupled to node NA1 and an n-channel MOS transistor MN6 having a drain terminal coupled to node B and a source terminal coupled to node NA2. The gate terminal of transistor MN5 is coupled to node NB1 and the gate terminal of transistor MN6 is coupled to node NB2.

A capacitor C1 has one terminal coupled to node NA1 and another terminal coupled to receive a clock signal CK. A capacitor C2 has one terminal coupled to node NA2 and another terminal coupled to receive a clock signal CKN (which is a logical inversion of the clock signal CK). A bootstrap capacitor Cbs1 has one terminal coupled to node NB1 and another terminal coupled to receive a clock signal CKH. A bootstrap capacitor Cbs2 has one terminal coupled to node NB2 and another terminal coupled to receive a clock signal CKHN (which is a logical inversion of the clock signal CKH).

The clock signals CKH and CKHN are generated from the clock signals CK and CKN using a clock voltage boosting circuit 110 shown in FIG. 2. The circuit 110 includes an n-channel MOS transistor 112 having a source terminal coupled to a positive supply voltage node VDD and a drain terminal coupled to node 114 and an n-channel MOS transistor 116 having a source terminal coupled to the VDD node and a drain terminal coupled to node 118. The transistors 112 and 116 are cross-coupled with the gate terminal of transistor 112 coupled to the drain terminal of transistor 116 at node 118 and the gate terminal of transistor 116 coupled to the drain terminal of transistor 112 at node 114.

A capacitor C1' has one terminal coupled to node 114 and another terminal coupled to receive the clock signal CK. A capacitor C2' has one terminal coupled to node 118 and another terminal coupled to receive the clock signal CKN.

A CMOS inverter 120 has an input coupled to the VDD node and an output generating the clock signal CKH. A source terminal of the p-channel MOS transistor in inverter 120 is coupled to the node 114 and a source terminal of the n-channel MOS transistor in inverter 120 is coupled to receive the clock signal CK.

A CMOS inverter 122 has an input coupled to the VDD node and an output generating the clock signal CKHN. A source terminal of the p-channel MOS transistor in inverter 122 is coupled to the node 118 and a source terminal of the n-channel MOS transistor in inverter 122 is coupled to receive the clock signal CKN.

The clock voltage boosting circuit 110 functions to level shift the clock signals CK and CKN to generate the clock signals CKH and CKHN. FIG. 3A shows the waveforms for the clock signals CK and CKN. FIG. 3B shows the waveforms for the clock signals CKH and CKHN. It will be noted that the clock voltage boosting circuit 110 functions to boost the high voltage level of the clock signals CKH and CKHN to 2*VDD, with the high voltage level of the clock signals CK and CKN being VDD. The clock signals CKH and CKHN have a same phase as the clock signals CK and CKN, respectively.

The voltage doubler circuit 100 of FIG. 1 is operable to generate either a positive voltage or a negative voltage. When the voltage doubler circuit 100 is to be used as a positive voltage doubler (i.e., operating in a high positive voltage mode), an input voltage such as the supply voltage VDD is connected to node A and an output voltage such as a high positive voltage of 2*VDD is generated at node B. Conversely, when the voltage doubler circuit 100 is to be used as a negative voltage doubler (i.e., operating in a high negative voltage mode), an input voltage such as the ground supply voltage GND is connected to node B and an output voltage such as a high negative voltage of –VDD is generated at node A.

The voltage doubler circuit 100 advantageously operates from just two clocks (CK/CKH and CKN/CKHN).

The voltage doubler circuit 100 operates as follows in the high positive voltage mode:

To begin, assume that no clock is present. In this situation, the nodes NA1 and NA2 will be charged to the VDD-Vt voltage level, where Vt is the threshold voltage of the n-channel MOS transistors MN1 and MN2. Now, assume the clock signal is applied. With the clock signal CK at the VDD voltage level and the clock signal CKN at the 0 (ground GND) voltage level, then the clock signal CKH is at the 2*VDD voltage level and the clock signal CKHN is at the 0 voltage level. In this configuration, the node NA1 will shift to the 2VDD-Vt voltage level and the node NA2 will shift to the VDD voltage level. Due to the cross coupling between transistors MN3 and MN4, the node NB1 will be charged to the 3*VDD voltage level and the node NB2 will be charged to the VDD voltage level. As the node NB1 is at the 3*VDD voltage level and the node NA1 is at the 2*VDD voltage level, the n-channel MOS transistor MN5 has sufficient Vgs (gate to source voltage) to pass the 2*VDD voltage from node NA1 to node B. In this way, a high positive voltage (higher than input supply voltage VDD) is generated and passed for output. So, during high positive voltage mode operation, the voltage VDD is applied at node A and the 2*VDD voltage is generated at node B. During the opposite phase of the clocks, the nodes NA1 and NA2 switch between the VDD voltage level and the 2*VDD voltage level. Similarly, the nodes NB1 and NB2 switch between the VDD voltage level and the 3*VDD voltage level.

The voltage doubler circuit 100 operates as follows in the high negative voltage mode:

With the ground reference voltage GND applied to node B, when the clock signal CKH transitions to the 2*VDD voltage level, the clock signal CK is simultaneously at the VDD voltage level, and the n-channel MOS transistor MN5 turns on and node NA1 is charged to the 0 (GND) voltage level. During the next clock cycle, the clock signal CKH switches from the 2*VDD voltage level to the 0 voltage level, with the clock signal CK changing state from the VDD voltage level to 0 voltage level, and the node NA1 accordingly transitions from the 0 voltage level to the −VDD voltage level. Also, the node NB1 discharges to the −VDD voltage level via the transistor MN3 and the switch off of the transistor MN5. In this way, the node NA1 also goes to the −VDD voltage level. Due to effect of the clock signals CKN and CKHN, the node NA2 is charged to the 0 (GND) voltage level via transistor MN6. As the NA2 is at the 0 voltage level, and the NA1 is at the −VDD voltage level, this configuration causes the transistor MN1 to turn on and pass the −VDD voltage level voltage to the node A. During this negative high voltage mode of operation, the nodes NA1 and NA2 switch between the 0 voltage level and the −VDD voltage level, and vice versa. Similarly, the nodes NB1 and NB2 switch between the VDD voltage level and the −VDD voltage level, and vice versa.

It will be noted that the foregoing voltage levels in the positive and negative operating modes are mentioned with the assumption of an ideal operating situation when there is no current load at the output and there is no charge loss.

Implementation of the circuit 100 as an integrated circuit utilizes three different isolated P-type wells (PWELLS) for the bulk (body) of the transistors. Those PWELLS include: a first PWELL associated with node A for the bulk of transistors MN1 and MN2; a second PWELL associated with node NA1 for the bulk of transistors MN3 and MN5; and a third PWELL associated with node NA2 for bulk of transistors MN4 and MN6. Those skilled in the art recognize that the provision of three different isolated PWELL structures will occupy a significant amount of integrated circuit area. Additionally, because of the local connection of the isolated bulk to the source terminals of the transistors, the bulk becomes capacitive due to associated capacitance on the source node (this being specifically a concern at nodes NA1 and NA2 due to the large capacitance provided by capacitors C1 and C2).

There is a need in the art to address the foregoing concerns.

SUMMARY

In an embodiment, a circuit comprises: a voltage multiplier circuit including: a first node configured to receive a first voltage when said voltage multiplier circuit is configured for operation in a positive voltage boosting mode and configured to output a negative voltage when said circuit is configured for operation in a negative voltage boosting mode; a second node configured to output a positive voltage in excess of said first voltage when said voltage multiplier circuit is configured for operation in the positive voltage boosting mode and configured to receive a second voltage in excess of said negative voltage when said circuit is configured for operation in a negative voltage boosting mode; and a plurality of transistors of a same conductivity type and sharing a common bulk that is not tied to a source of any transistor in said plurality of transistors; and a bias generator circuit coupled to receive a first voltage from the first node and second voltage from the second node, said bias generator circuit configured to apply a lower one of the first and second voltages to the common bulk.

In an embodiment, a circuit comprises: a first node; a second node; a first transistor and second transistor connected in a cross-coupled configuration, wherein the first transistor is coupled between the first node and a first intermediate node and the second transistor is coupled between the first node and a second intermediate node; a third transistor and fourth transistor connected in a cross-coupled configuration, wherein the third transistor is coupled between the first intermediate node and a third intermediate node and the fourth transistor is coupled between the second intermediate node and a fourth intermediate node; a fifth transistor coupled between the first intermediate node and the second node and having a control terminal coupled to the third intermediate node; a sixth transistor coupled between the second intermediate node and the second node and having a control terminal coupled to the fourth intermediate node; wherein the first through sixth transistors share a common bulk that is not tied to a source of any transistor in said first through sixth transistors; and a bias generator circuit coupled to receive a first voltage from the first node and second voltage from the second node, said bias generator circuit configured to apply a lower one of the first and second voltages to the common bulk; wherein the first and second intermediate nodes are capacitively coupled to receive opposite phases of a first clock signal, respectively; and wherein the third and fourth intermediate nodes are capacitively coupled to receive opposite phases of a second clock signal, respectively.

In an embodiment, a circuit comprises: a first node; a second node; a first transistor and second transistor, wherein the first transistor is coupled between the first node and the first intermediate node and wherein the second transistor is coupled between the first node and the second intermediate node; a third transistor and fourth transistor, wherein the third transistor is coupled between the first intermediate node and the third intermediate node and wherein the fourth transistor is coupled between the second intermediate node and the fourth intermediate node, with gates of the first and fourth transistors coupled to the third intermediate node and with gates of the second and third transistors coupled to the fourth intermediate node; a fifth transistor coupled between the first intermediate node and the second node and having a control terminal coupled to the fourth intermediate node; a sixth transistor coupled between the second intermediate node and the second node and having a control terminal coupled to the third intermediate node; wherein the first through sixth transistors share a common bulk that is not tied to a source of any transistor in said first through sixth transistors; and a bias generator circuit coupled to receive a first voltage from the first node and second voltage from the second node, said bias generator circuit configured to apply a lower one of the first and second voltages to the common bulk; wherein the first and second intermediate nodes are capacitively coupled to receive opposite phases of a first clock signal, respectively; and wherein the third and fourth intermediate nodes are capacitively coupled to receive opposite phases of a second clock signal, respectively.

In an embodiment, a circuit comprises: a first node; a second node; a first transistor and second transistor, wherein the first transistor is coupled between the first node and the first intermediate node and wherein the second transistor is coupled between the first node and the second intermediate node; a third transistor and fourth transistor, wherein the third transistor is coupled between the first intermediate node and the third intermediate node and wherein the fourth transistor is coupled between the second intermediate node and the fourth intermediate node, with gates of the first and fourth transistors coupled to the third intermediate node and with gates of the second and third transistors coupled to the fourth intermediate node; a fifth transistor coupled between the first intermediate node and the second node and having a control terminal coupled to the fourth intermediate node; and a sixth transistor coupled between the second intermediate node and the second node and having a control terminal coupled to the third intermediate node; wherein the first and second intermediate nodes are capacitively coupled to receive opposite phases of a first clock signal, respectively; and wherein the third and fourth intermediate nodes are capacitively coupled to receive opposite phases of a second clock signal, respectively.

In an embodiment, a circuit, comprises: a voltage multiplier circuit including: first and second intermediate nodes that are capacitively coupled to receive opposite phases of a first clock signal, respectively; and a first transistor and a second transistor connected in a cross-coupled configuration, wherein a first conduction terminal of the first transistor and a gate terminal of the second transistor are connected to the first intermediate node and wherein a first conduction terminal of the second transistor and a gate terminal of the first transistor are connected to the second intermediate node; wherein said first and second transistors have a same conductivity type and share a common bulk that is not tied to a source of either of said first and second transistors; and a bias generator circuit configured to apply a bias voltage to the common bulk of the first and second transistors.

In an embodiment, a circuit comprises: a first node; a second node; a first transistor and second transistor connected in a cross-coupled configuration, wherein the first transistor is coupled between the first node and a first intermediate node and the second transistor is coupled between the first node and a second intermediate node; wherein the first and second intermediate nodes are capacitively coupled to receive opposite phases of a first clock signal, respectively; a third transistor coupled between the first intermediate node and the second node; a fourth transistor coupled between the second intermediate node and the second node; wherein the first through fourth transistors share a common bulk that is not tied to a source of any transistor in said first through fourth transistors; and a bias generator circuit coupled to receive a first voltage from the first node and a second voltage from the second node, said bias generator circuit configured to apply a lower one of the first and second voltages to the common bulk.

BRIEF DESCRIPTION OF THE DRAWINGS

For a better understanding of the embodiments, reference will now be made by way of example only to the accompanying figures in which.

DETAILED DESCRIPTION

Figure 4:
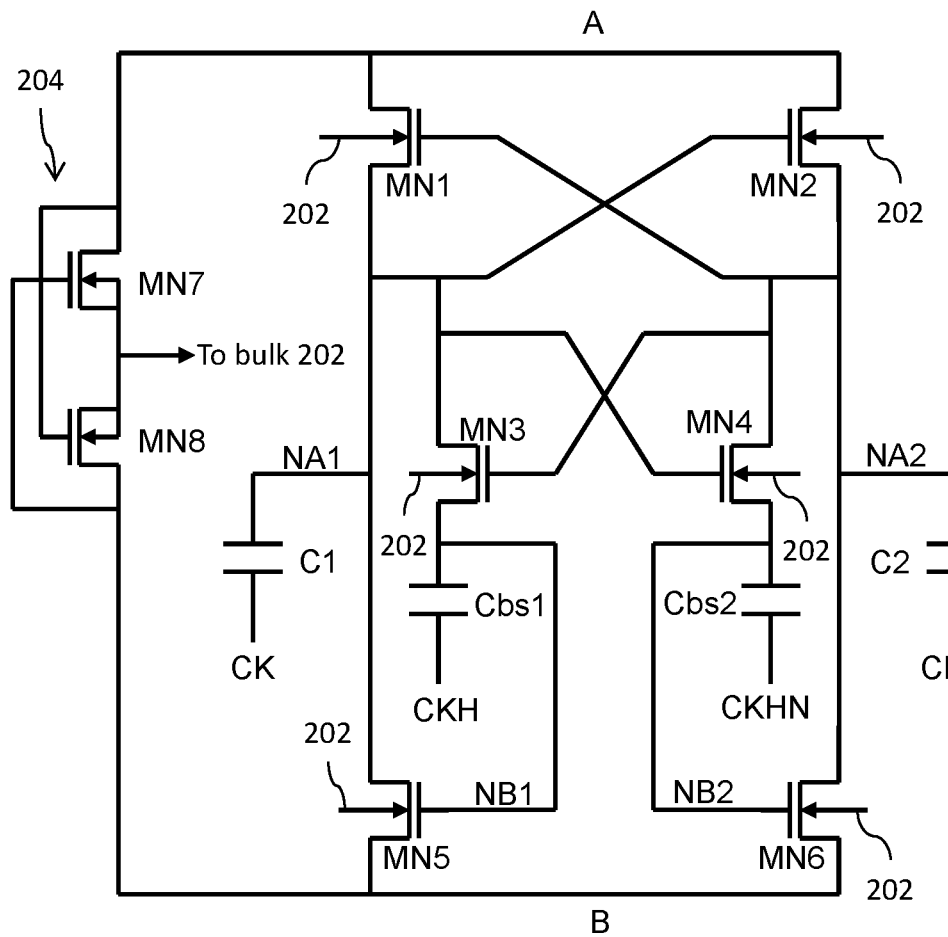
FIG. 4 is a circuit diagram for a voltage doubler.

Reference is now made to FIG. 4 showing a circuit diagram for a voltage doubler circuit 200. Like references refer to like or similar components in FIG. 1. The voltage doubler circuit 200 differs from the voltage doubler circuit 100 that each of the n-channel transistors MN1-MN6 for the circuit 200 are formed to share a common bulk (body) 202. A further difference is that the source terminals of the n-channel MOS transistors MN1-MN6 are not tied to the common bulk 202. The common bulk 202 is not, however, a floating node. Yet another difference is that the circuit 200 further includes a circuit 204 to bias the common bulk 202.

The bias circuit 204 is formed by a pair of n-channel MOS transistors MN7 and MN8 whose source-drain paths are connected in series between node A and node B. More specifically, the drain of transistor MN7 is connected to node A and the drain of transistor MN8 is connected to node B. The sources of transistors MN7 and MN8 are connected to each other and output the bulk bias voltage that is applied to the common bulk 202. The gate of transistor MN7 is connected to the drain of transistor MN8 at node B and the gate of transistor MN8 is connected to the drain of transistor MN7 at node A. The transistors MN7 and MN8 thus have a cross-coupled circuit configuration.

The effect of the cross-coupled circuit configuration of transistors MN7 and MN8 between nodes A and B is that the output bulk bias voltage applied to the common bulk 202 will always remain at a lower voltage among the voltages present at nodes A and B, regardless of operation of the circuit 200 in the high positive voltage mode or high negative voltage mode. This ensures that in the static case there is no forward biasing of the common bulk 202. So, in the case of operation in the high positive voltage mode (for example, VDD applied to node A and 2*VDD output from node B), the voltage at node A is lower than the voltage at node B and the bias circuit 204 will bias the common bulk 202 at the VDD voltage at node A. In the case of operation in the high negative voltage mode (for example, GND applied to node B and −VDD output from node A), the voltage at node A is lower than the voltage at node B, the bias circuit 204 biases the common bulk 202 at the voltage at node A.

Figure 5:
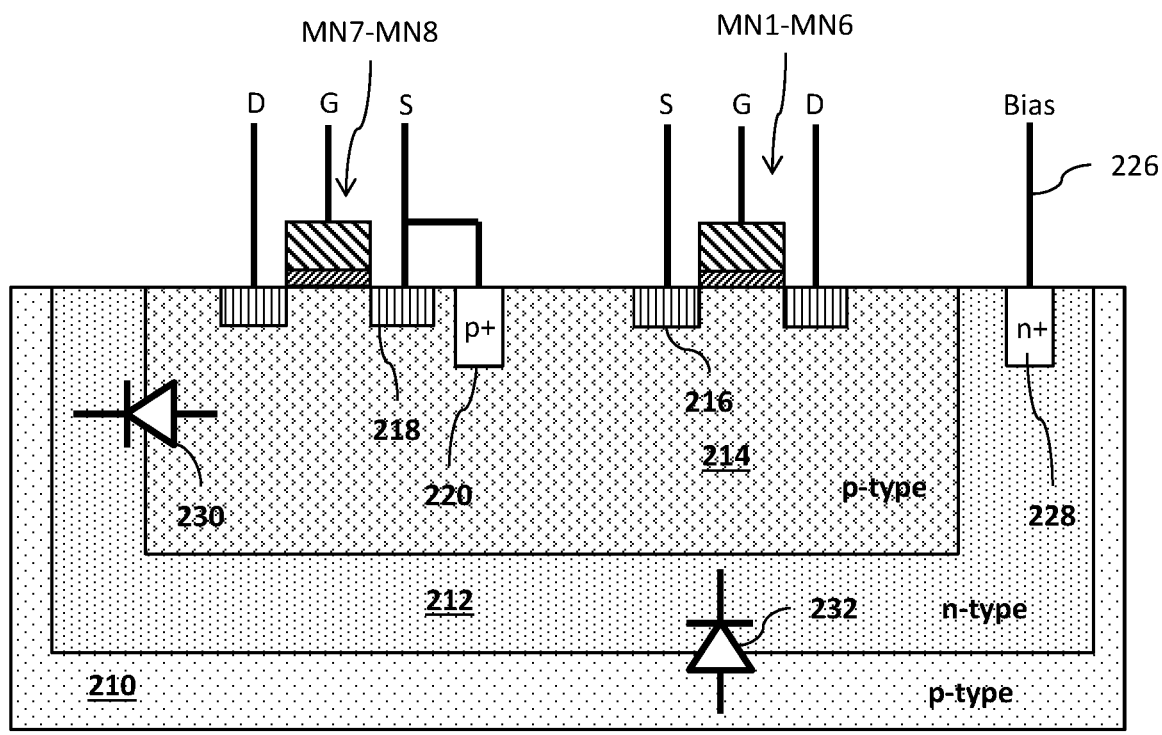
FIG. 5 is a cross-section diagram of a triple well technology implementation of the circuit of FIG. 4.

Reference is now made to FIG. 5. Fabrication of the circuit 200 may take advantage of triple well technology where the circuit 200 is fabricated using an isolated p-type substrate 210. An n-type well 212 is formed within the p-type substrate 210. The p-type common bulk 202 is then formed by a p-type well 214 within the n-type well 212. The n-type source and drain regions (generally referenced as 216) for the transistors MN1-MN6 are then formed within the p-type well 214 of the common bulk 202. The sources of the transistors MN1-MN6 are not tied to the p-type well 214 of the common bulk 202. Transistors MN7 and MN8 for the bias circuit 204 are also formed in the p-type well 214 of the common bulk 202 and differ in construction from the transistors MN1-MN6 in that the sources 218 of transistors MN7 and MN8 are tied to their bulk in the p-type substrate 210 through highly doped p-type region 220.

The triple well technology structure forms two parasitic diodes 230 and 232. A first parasitic diode 230 is formed between the isolated p-type well 214 and the n-type well 212. A second parasitic diode 232 is formed between the p-type substrate 210 and the n-type well 212. In this implementation, the p-type substrate 210 is biased at the ground voltage and the bulk of all transistors MN1-MN8 is at the same potential. In order to ensure that neither of the parasitic diodes 230 and 232 becomes forward biased, a bias signal 226 for the n-type well 212 applies a most positive voltage of the integrated circuit (of course, respecting a safe operating area limit of the integrated circuit) through the highly doped n-type region 228.

Figure 1:
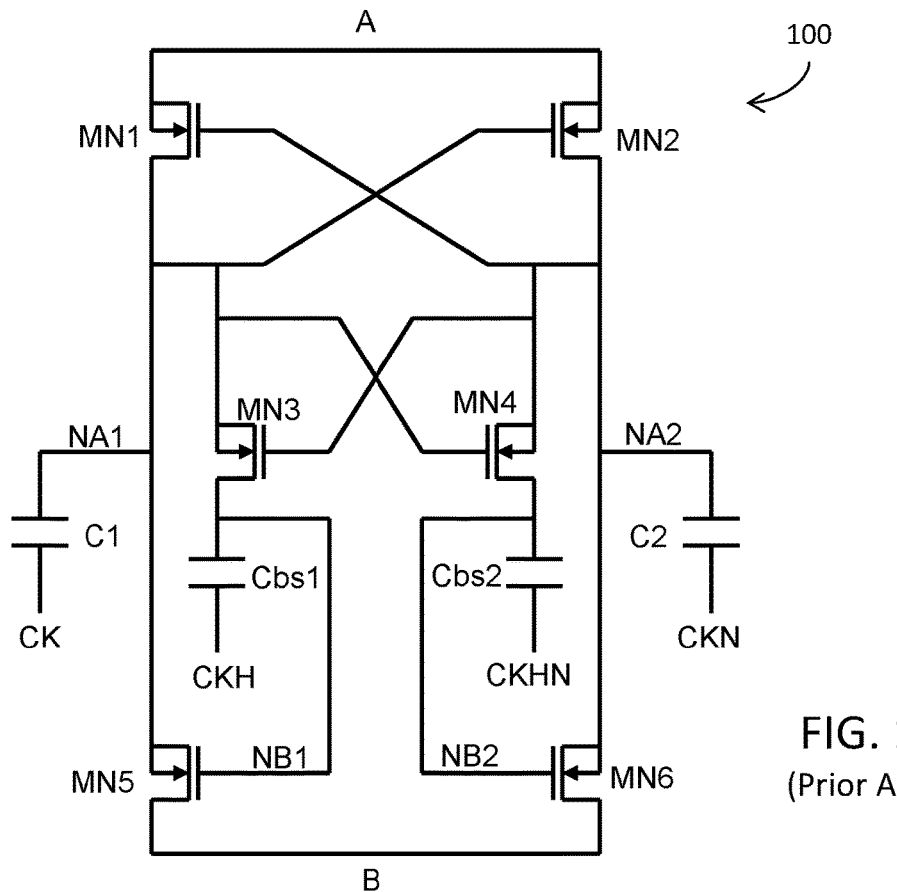
FIG. 1 is a circuit diagram for a voltage doubler.

The implementation of the circuit 200 addresses the concerns with the circuit 100 of FIG. 1. Occupied area is reduced because only a single isolated PWELL is used by all of the transistors MN1-MN8. Parasitic capacitance is addressed because the common bulk 202 is less capacitive as a result of it not being connected to any capacitor associated with the nodes NA1 or NA2. As a result, the bulk will be first to charge/discharge and this means that there is a reduced probability of bulk current in any operating condition.

Figure 6:
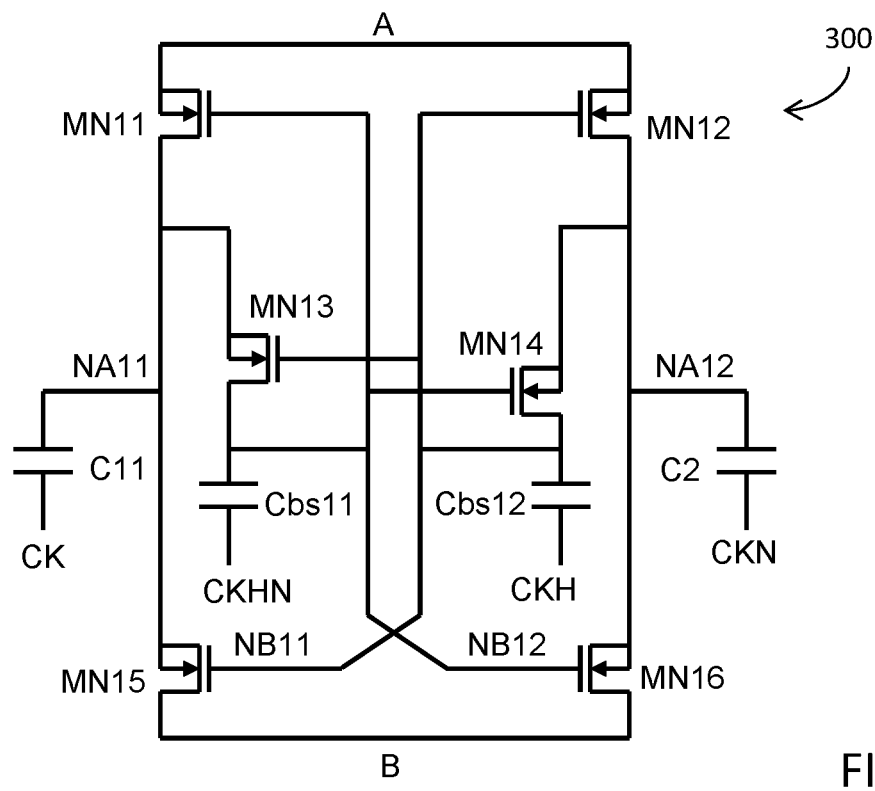
FIG. 6 is a circuit diagram for a voltage doubler.

Reference is made to FIG. 6 showing a circuit diagram for a voltage doubler circuit 300. The circuit 300 includes an n-channel MOS transistor MN11 having a source terminal coupled to node A and a drain terminal coupled to node NA11 and an n-channel MOS transistor MN12 having a source terminal coupled to node A and a drain terminal coupled to node NA12. The gate terminal of transistor MN11 is coupled to node NB12 and the gate terminal of transistor MN12 is coupled to node NB11.

The circuit 300 further includes an n-channel MOS transistor MN13 having a source terminal coupled to node NA11 and a drain terminal coupled to node NB12 and an n-channel MOS transistor MN14 having a source terminal coupled to node NA12 and a drain terminal coupled to node NB11. The gate terminal of transistor MN13 is coupled to node NB11 and the gate terminal of transistor MN14 is coupled to node NB12.

The circuit 300 still further includes an n-channel MOS transistor MN15 having a drain terminal coupled to node B and a source terminal coupled to node NA11 and an n-channel MOS transistor MN16 having a drain terminal coupled to node B and a source terminal coupled to node NA12. The gate terminal of transistor MN15 is coupled to node NB11 and the gate terminal of transistor MN16 is coupled to node NB12.

A capacitor C11 has one terminal coupled to node NA11 and another terminal coupled to receive a clock signal CK. A capacitor C12 has one terminal coupled to node NA12 and another terminal coupled to receive a clock signal CKN (which is a logical inversion of the clock signal CK). A bootstrap capacitor Cbs11 has one terminal coupled to node NB12 and another terminal coupled to receive a clock signal CKHN. A bootstrap capacitor Cbs12 has one terminal coupled to node NB11 and another terminal coupled to receive a clock signal CKH (which is a logical inversion of the clock signal CKHN).

Figure 2:
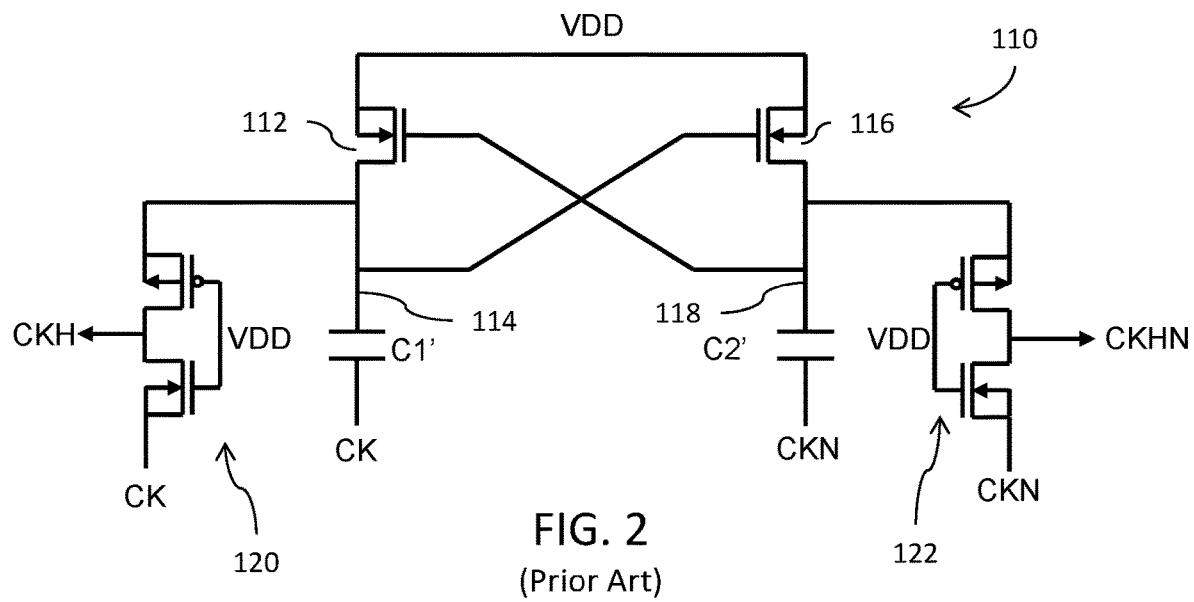
FIG. 2 is a circuit diagram for a clock voltage boosting circuit.
Figure 3A:
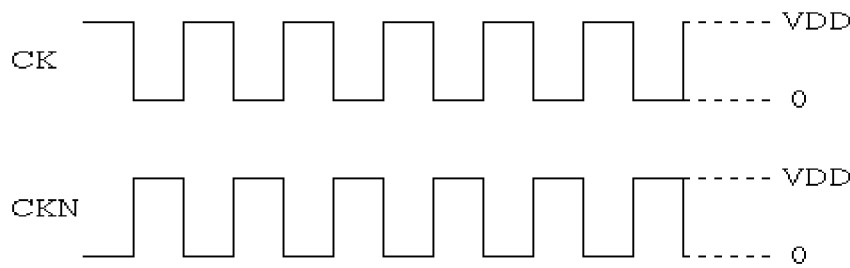
FIGS. 3A and 3B show clock signal waveforms.
Figure 3B:
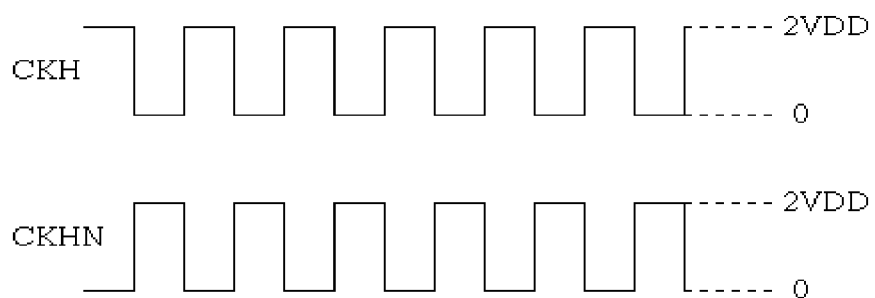

The clock signals CKH and CKHN are generated from the clock signals CK and CKN using a clock voltage boosting circuit 110 shown in FIG. 2.

The voltage doubler circuit 300 of FIG. 6 is operable to generate either a positive voltage or a negative voltage. When the voltage doubler circuit 300 is to be used as a positive voltage doubler (i.e., operating in a high positive voltage mode), an input voltage such as the supply voltage VDD is connected to node A and an output voltage such as a high positive voltage of 2*VDD is generated at node B. Conversely, when the voltage doubler circuit 200 is to be used as a negative voltage doubler (i.e., operating in a high negative voltage mode), an input voltage such as the ground supply voltage GND is connected to node B and an output voltage such as a high negative voltage of −VDD is generated at node A.

The voltage doubler circuit 300 advantageously operates from just two clocks (CK/CKH and CKN/CKHN).

The voltage doubler circuit 300 operates as follows in the high positive voltage mode:

When circuit is used for positive voltage generation, supply voltage VDD is applied to "A" node and with no clock condition, nodes NA11 and NA12 will be charged to "VDD−Vtn" voltage levels. As soon as clock is enabled, assuming CK is "VDD", CKN is "0", CKH is "2*VDD" and CKHN is "0". With this configuration, node NA11 will be charged to "2*VDD-Vtn" and NA12 will be charged to "VDD". Due to cross coupled MN13 and MN14, NB11 and NB12 will be charged to "3*VDD" and "VDD" respectively. As NB11 is at "3*VDD" and NA11 is at "2*VDD" so NMOS MN15 has sufficient Vgs to pass 2*VDD voltage from node NA1 to "B". In this way, a positive voltage (higher than input supply voltage) is generated and passed on to output node to drive capacitive and current load. During different clock cycles, node NA11 and NA12 switches between "VDD" and "2*VDD". Similarly NB11 and NB12 switches between "VDD" and "3*VDD" voltage level.

The voltage doubler circuit 300 operates as follows in the high negative voltage mode:

When the same circuit is used as negative voltage generator, then clock configuration remains same, but input is applied at "B" node and output is taken from "A" node. During negative voltage configuration, "B" node is connected to "GND" and in no clock condition, NA11 and NA12 will be charged to "Vtn" voltage level. When CKH goes to "2*VDD" (at this time CK is "VDD") it switch ON the NMOS MN15 and charges node NA11 to "0". During next clock cycle, when CKH switches from "2*VDD" to "0" and CK changes state from "VDD" to "0" then node NA11 moves from "0" to "−VDD". Also node NB11 discharges to "−VDD" via transistor MN14 and switch-OFF the transistor MN15. In this way, node NA11 reaches to −VDD voltage level. Due to effect of CKN and CKHN, node NA12 is charged to "0" via MN16. As NA11 is at "−VDD" and NB12 is at "VDD" so this configuration switch-ON the transistor "MN11" and pass "−VDD" voltage to "A" node. In this way a negative voltage is generated and passed to "A" node. During negative voltage configuration, node NA11 and NA12 switches between "0/−VDD" and vice versa. Similarly nodes NB11 and NB12 switches between "VDD/−VDD" and vice versa.

It will be noted that the foregoing voltage levels for positive and negative operation are mentioned with the assumption of an ideal operating situation when there is no current load at the output and there is no charge loss.

In an embodiment, an implementation of the circuit 300 as an integrated circuit utilizes three different isolated P-type wells (PWELLS) for the bulk (body) of the transistors. Those PWELLS include: a first PWELL associated with node A for the bulk of transistors MN11 and MN12; a second PWELL associated with node NA11 for the bulk of transistors MN13 and MN15; and a third PWELL associated with node NA12 for bulk of transistors MN14 and MN16. In this implementation, the sources of the various transistors MN11-MN16 are tied to their respective bulks.

Figure 7:
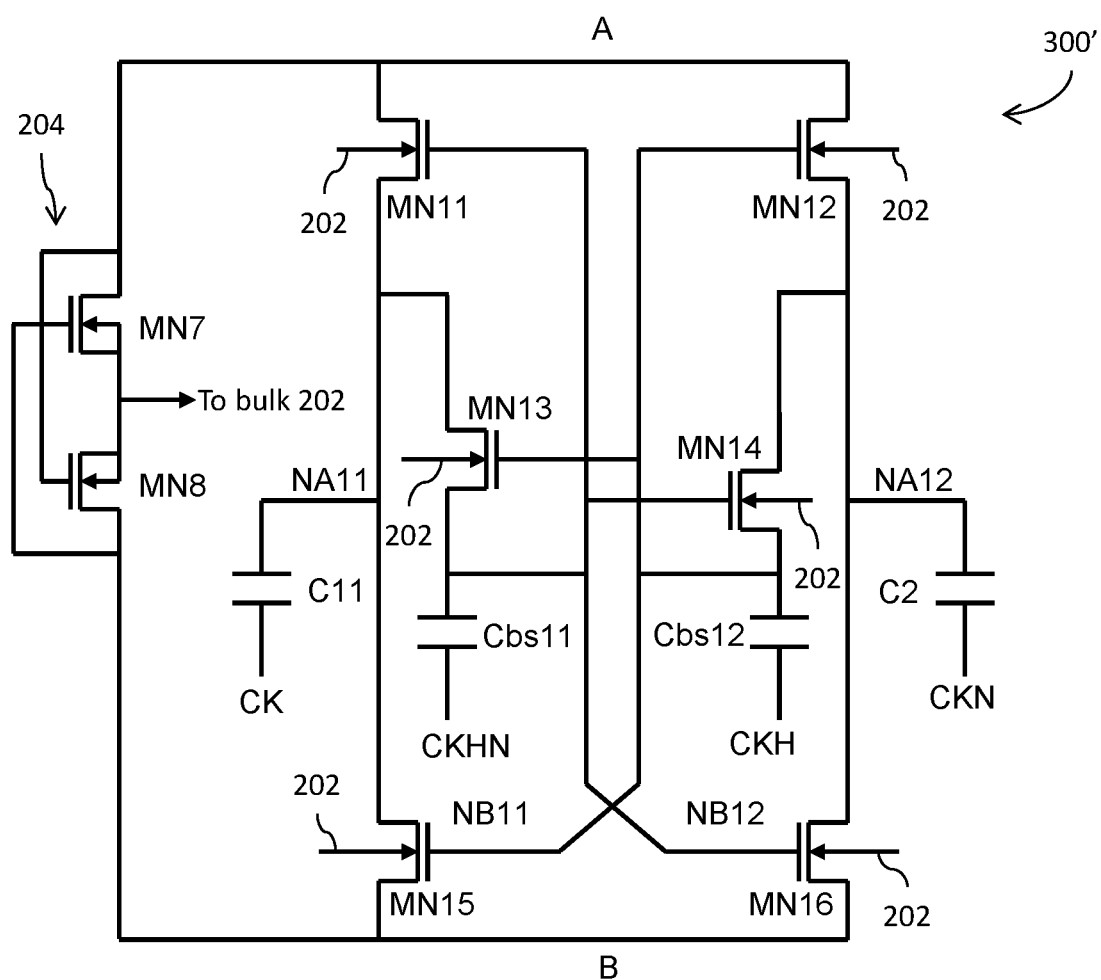
FIG. 7 is a circuit diagram for a voltage doubler.

In an alternative implementation, as shown in FIG. 7, the circuit 300' differs from the voltage doubler circuit 300 that each of the n-channel transistors MN11-MN16 for the circuit 300' are formed to share a common bulk (body) 202. A further difference is that the source terminals of the n-channel MOS transistors MN11-MN16 are not tied to the common bulk 202. The common bulk 202 is not, however, a floating node. Yet another difference is that the circuit 200' further includes a circuit 204 to bias the common bulk 202.

The bias circuit 204 is formed by a pair of n-channel MOS transistors MN7 and MN8 whose source-drain paths are connected in series between node A and node B. More specifically, the drain of transistor MN7 is connected to node A and the drain of transistor MN8 is connected to node B. The sources of transistors MN7 and MN8 are connected to each other and output the bulk bias voltage that is applied to the common bulk 202. The gate of transistor MN7 is connected to the drain of MN8 at node B and the gate of transistor MN8 is connected to the drain of MN7 at node A. The transistors MN7 and MN8 thus have a cross-coupled circuit configuration.

The effect of the cross-coupled circuit configuration of transistors MN7 and MN8 between nodes A and B is that the output bulk bias voltage applied to the common bulk 202 will always remain at a lower voltage among the voltages present at nodes A and B, regardless of operation of the circuit 300 in the high positive voltage mode or high negative voltage mode. This ensures that in the static case there is no forward biasing of the common bulk 202. So, in the case of operation in the high positive voltage mode (for example, with VDD applied to node A and 2*VDD output from node B), the voltage at node A is lower than the voltage at node B and the bias circuit 204 will bias the common bulk 202 at the VDD voltage at node A. In the case of operation in the high negative voltage mode (for example, with GND applied to node B and −VDD output from node A), the voltage at node A is lower than the voltage at node B, the bias circuit 204 biases the common bulk 202 at the voltage at node A.

Fabrication of the circuit 300' may take advantage of triple well technology as shown in FIG. 5 and previously described.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A circuit, comprising:
a voltage multiplier circuit including:
first and second intermediate nodes that are capacitively coupled to receive opposite phases of a first clock signal, respectively;
a first transistor having a first conduction terminal connected to the first intermediate node;
a second transistor having a first conduction terminal connected to the second intermediate node; and
a third transistor and a fourth transistor connected in a cross-coupled configuration, wherein a first conduction terminal of the third transistor is connected to a gate terminal of the first transistor and a gate terminal of the fourth transistor, wherein a first conduction terminal of the fourth transistor is connected to a gate terminal of the second transistor and a gate terminal of the third transistor, wherein a second conduction terminal of the third transistor is connected to the first intermediate node and wherein a second conduction terminal of the fourth transistor is connected to the second intermediate node;
wherein said third and fourth transistors have a same conductivity type and share a common bulk that is not tied to a source of either of said third and fourth transistors; and
a bias generator circuit configured to apply a bias voltage to the common bulk of the third and fourth transistors.

2. A circuit, comprising:
a voltage multiplier circuit including:
first and second intermediate nodes that are capacitively coupled to receive opposite phases of a first clock signal, respectively;
a first transistor having a first conduction terminal connected to the first intermediate node;
a second transistor having a first conduction terminal connected to the second intermediate node; and
a third transistor and a fourth transistor connected in a cross-coupled configuration, wherein a first conduction terminal of the third transistor is connected to a gate terminal of the first transistor and a gate terminal of the fourth transistor and wherein a first conduction terminal of the fourth transistor is connected to a gate terminal of the second transistor and a gate terminal of the third transistor;
wherein said third and fourth transistors have a same conductivity type and share a common bulk that is not tied to a source of either of said third and fourth transistors; and
a bias generator circuit configured to apply a bias voltage to the common bulk of the third and fourth transistors;
wherein the bias generator circuit receives a first voltage from a first node and a second voltage from a second node, said bias generator circuit configured to apply a lower one of the first and second voltages to the common bulk.

3. The circuit of claim 2, wherein each of the first and second transistors has a source-drain path coupled between the first node and the second node.

4. The circuit of claim 3, wherein sources of the first transistor and second transistor are connected to the first node.

5. The circuit of claim 2, wherein said bias generator circuit comprises: a first biasing transistor and a second biasing transistor having source-drain paths coupled in series between the first and second nodes at a common source that is connected to said common bulk and wherein gates of the first and second biasing transistors are cross-coupled to drains of the second and first biasing transistors, respectively.

6. The circuit of claim 5, wherein the first and second biasing transistors have the same conductivity type as the first, second, third and fourth transistors of the voltage multiplier circuit.

7. The circuit of claim 6, wherein the first and second biasing transistors have sources and drains formed in the common bulk and wherein the third and fourth transistors of the voltage multiplier circuit have sources and drains formed in the common bulk.

8. A circuit, comprising:
a voltage multiplier circuit including:
first and second intermediate nodes that are capacitively coupled to receive opposite phases of a first clock signal, respectively;
a first transistor having a first conduction terminal connected to the first intermediate node;
a second transistor having a first conduction terminal connected to the second intermediate node; and
a third transistor and a fourth transistor connected in a cross-coupled configuration, wherein a first conduction terminal of the third transistor is connected to a gate terminal of the first transistor and a gate terminal of the fourth transistor and wherein a first conduction terminal of the fourth transistor is connected to a gate terminal of the second transistor and a gate terminal of the third transistor;
wherein said third and fourth transistors have a same conductivity type and share a common bulk that is not tied to a source of either of said third and fourth transistors; and
a bias generator circuit configured to apply a bias voltage to the common bulk of the third and fourth transistors;
wherein said first and second transistors have a same conductivity type and share said common bulk that is not tied to a source of either of said first and second transistors.

9. The circuit of claim 8, wherein said first, second, third and fourth transistors are implemented in a triple well technology including a p-type region, an isolated n-type well in the p-type region and a p-type well forming said common bulk in the isolated n-type well.

10. The circuit of claim 9, further comprising an additional bias for biasing the isolated n-type well at a voltage level at least as high as a voltage at the p-type region and a voltage at the common bulk.

11. A circuit, comprising:
a voltage multiplier circuit including:
first and second intermediate nodes that are capacitively coupled to receive opposite phases of a first clock signal, respectively;
a first transistor having a first conduction terminal connected to the first intermediate node;
a second transistor having a first conduction terminal connected to the second intermediate node; and
a third transistor and a fourth transistor connected in a cross-coupled configuration, wherein a first conduction terminal of the third transistor is connected to a gate terminal of the first transistor and a gate terminal of the fourth transistor and wherein a first conduction terminal of the fourth transistor is connected to a gate terminal of the second transistor and a gate terminal of the third transistor;
wherein said third and fourth transistors have a same conductivity type and share a common bulk that is not tied to a source of either of said third and fourth transistors; and
a bias generator circuit configured to apply a bias voltage to the common bulk of the third and fourth transistors;
wherein the voltage multiplier circuit further includes:
third and fourth intermediate nodes that are capacitively coupled to receive opposite phases of a second clock signal, respectively;
wherein the third intermediate node is connected to the first conduction terminal of the third transistor and wherein the fourth intermediate node is connected to the first conduction terminal of the fourth transistor.

12. The circuit of claim 11, wherein the first and second clock signals have aligned phases.

13. A circuit, comprising:
a voltage multiplier circuit including:
first and second intermediate nodes that are capacitively coupled to receive opposite phases of a first clock signal, respectively;
a first transistor having a first conduction terminal connected to the first intermediate node;
a second transistor having a first conduction terminal connected to the second intermediate node; and
a third transistor and a fourth transistor connected in a cross-coupled configuration, wherein a first conduction terminal of the third transistor is connected to a gate terminal of the first transistor and a gate terminal of the fourth transistor and wherein a first conduction terminal of the fourth transistor is connected to a gate terminal of the second transistor and a gate terminal of the third transistor;
wherein said third and fourth transistors have a same conductivity type and share a common bulk that is not tied to a source of either of said third and fourth transistors; and
a bias generator circuit configured to apply a bias voltage to the common bulk of the third and fourth transistors;
wherein the voltage multiplier circuit further includes:
a first node configured to receive a first voltage when said voltage multiplier circuit is configured for operation in a positive voltage boosting mode and configured to output a negative voltage when said circuit is configured for operation in a negative voltage boosting mode; and
a second node configured to output a positive voltage in excess of said first voltage when said voltage multiplier circuit is configured for operation in the positive voltage boosting mode and configured to receive a second voltage in excess of said negative voltage when said circuit is configured for operation in a negative voltage boosting mode;
wherein source-drain paths of said first and second transistors are coupled between the first and second nodes.

14. The circuit of claim 13, wherein said bias generator circuit is coupled to receive the first voltage from the first node and the second voltage from the second node, said bias generator circuit configured to apply a lower one of the first and second voltages to the common bulk.

15. The circuit of claim 13, wherein said bias generator circuit comprises: a first biasing transistor and a second biasing transistor having source-drain paths coupled in series between the first and second nodes at a common source and wherein gates of the first and second biasing transistors are cross-coupled to drains of the second and first biasing transistors, respectively.

16. The circuit of claim 15, wherein the first and second biasing transistors have the same conductivity type as the first, second, third and fourth transistors of the voltage multiplier circuit.

17. The circuit of claim 16, wherein the first and second biasing transistors have sources and drains formed in the common bulk with sources and drains of the first and second transistors of the voltage multiplier circuit.

18. A circuit, comprising:
a voltage multiplier circuit including:
first and second intermediate nodes that are capacitively coupled to receive opposite phases of a first clock signal, respectively;

third and fourth intermediate nodes that are capacitively coupled to receive opposite phases of a second clock signal, respectively;

a first transistor and a second transistor connected in a cross-coupled configuration, wherein:
- a first conduction terminal of the first transistor is connected the first intermediate node and wherein a second conduction terminal of the first transistor is connected to a gate terminal of the second transistor and the third intermediate node; and
- a first conduction terminal of the second transistor is connected the second intermediate node and wherein a second conduction terminal of the second transistor is connected to a gate terminal of the first transistor and the fourth intermediate node;

wherein said first and second transistors have a same conductivity type and share a common bulk that is not tied to a source of either of said first and second transistors; and a bias generator circuit configured to apply a bias voltage to the common bulk of the first and second transistors.

19. The circuit of claim 18, wherein the first and second clock signals have aligned phases.

20. The circuit of claim 18, further comprising:
- a third transistor having a source-drain path coupled between a first node and a second node, wherein a gate terminal of the third transistor is connected to the third intermediate node; and
- a fourth transistor having a source-drain path coupled between the first node and the second node, wherein a gate terminal of the fourth transistor is connected to the fourth intermediate node.

21. The circuit of claim 20, wherein said third and fourth transistors have a same conductivity type and share said common bulk that is not tied to a source of either of said third and fourth transistors.

22. The circuit of claim 21, wherein said first through fourth transistors are implemented in a triple well technology including a p-type region, an isolated n-type well in the p-type region and a p-type well forming said common bulk in the isolated n-type well.

23. The circuit of claim 22, further comprising an additional bias for biasing the isolated n-type well at a voltage level at least as high as a voltage at the p-type region and a voltage at the common bulk.

24. The circuit of claim 20, wherein the bias generator circuit receives a first voltage from the first node and a second voltage from the second node, said bias generator circuit configured to apply a lower one of the first and second voltages to the common bulk.

25. The circuit of claim 24, wherein sources of the third transistor and fourth transistors are connected to the first node.

26. The circuit of claim 20, wherein said bias generator circuit comprises: a first biasing transistor and a second biasing transistor having source-drain paths coupled in series between the first and second nodes at a common source that is connected to said common bulk and wherein gates of the first and second biasing transistors are cross-coupled to drains of the second and first biasing transistors, respectively.

27. The circuit of claim 26, wherein the first and second biasing transistors have the same conductivity type as the first, second, third and fourth transistors of the voltage multiplier circuit.

28. The circuit of claim 27, wherein the first and second biasing transistors have sources and drains formed in the common bulk and wherein the third and fourth transistors of the voltage multiplier circuit have sources and drains formed in the common bulk.

29. The circuit of claim 20, wherein:
- the first node is configured to receive a first voltage when said voltage multiplier circuit is configured for operation in a positive voltage boosting mode and configured to output a negative voltage when said circuit is configured for operation in a negative voltage boosting mode; and
- the second node is configured to output a positive voltage in excess of said first voltage when said voltage multiplier circuit is configured for operation in the positive voltage boosting mode and configured to receive a second voltage in excess of said negative voltage when said circuit is configured for operation in a negative voltage boosting mode.

30. The circuit of claim 29, wherein said bias generator circuit is coupled to receive the first voltage from the first node and the second voltage from the second node, said bias generator circuit configured to apply a lower one of the first and second voltages to the common bulk.

31. The circuit of claim 29, wherein said bias generator circuit comprises: a first biasing transistor and a second biasing transistor having source-drain paths coupled in series between the first and second nodes at a common source and wherein gates of the first and second biasing transistors are cross-coupled to drains of the second and first biasing transistors, respectively.

32. The circuit of claim 31, wherein the first and second biasing transistors have the same conductivity type as the first and second transistors of the voltage multiplier circuit.

33. The circuit of claim 31, wherein the first and second biasing transistors have sources and drains formed in the common bulk with sources and drains of the first and second transistors of the voltage multiplier circuit.

\* \* \* \* \*